US006828758B2

(12) United States Patent
Ishishita

(10) Patent No.: US 6,828,758 B2
(45) Date of Patent: Dec. 7, 2004

(54) CHARGE/DISCHARGE CONTROL METHOD FOR BATTERY PACK AND CHARGE/DISCHARGE CONTROL APPARATUS FOR BATTERY PACK

(75) Inventor: Teruo Ishishita, Nishikamo-gun (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 67 days.

(21) Appl. No.: 10/361,917

(22) Filed: Feb. 11, 2003

(65) Prior Publication Data

US 2003/0155891 A1 Aug. 21, 2003

(30) Foreign Application Priority Data

Feb. 20, 2002 (JP) ........................................ 2002-043216

(51) Int. Cl.[7] ............................................ H01M 10/46
(52) U.S. Cl. ....................................................... 320/116
(58) Field of Search ................................ 320/132, 104, 320/110, 116, 118, 119

(56) References Cited

U.S. PATENT DOCUMENTS 5,206,578 A    4/1993  Nor
6,133,707 A  * 10/2000  Kikuchi et al. ............. 320/118

FOREIGN PATENT DOCUMENTS

| EP | 0 967 108 A1 | 12/1999 |
| JP | 11-174135 A | 7/1999 |
| JP | 2000-14029 A | 1/2000 |

OTHER PUBLICATIONS

European Patent Office Communication dated Jun. 13, 2003 with attached European Search Report dated Jun. 4, 2003.

* cited by examiner

*Primary Examiner*—Edward H. Tso
(74) *Attorney, Agent, or Firm*—Kenyon & Kenyon

(57) ABSTRACT

It is an object of the invention to provide a charge/discharge control apparatus for a battery pack which is capable of performing SOC control and reducing the SOC variation through simple processes, and a control method thereof. In order to achieve the aforementioned object, A charge/discharge control apparatus for a battery pack having a plurality of cells according to one aspect of the invention includes a voltage detection portion that measures a voltage of each set of a predetermined number of cells provided in the battery pack, a computation portion that computes a state quantity of each set of the predetermined number of cells based on the voltage measured by the voltage detection portion, and a charge/discharge control portion that performs a charge/discharge control based on a least state quantity that is a least one of the state quantities of the sets of the predetermined number of cells.

30 Claims, 3 Drawing Sheets

LEAST SOC

LEAST SOC

CHARGE/DISCHARGE CONTROL METHOD FOR BATTERY PACK AND CHARGE/DISCHARGE CONTROL APPARATUS FOR BATTERY PACK

INCORPORATION BY REFERENCE

The disclosure of Japanese Patent Application No. 2002-043216 filed on Feb. 20, 2002 including the specification, drawings and abstract is incorporated herein by reference in its entirety.

BACKGROUND OF THE INVENTION

1. Field of the Invention

The invention relates to a charge/discharge control apparatus and method for a battery pack in which a plurality of battery cells are connected in series, and to a control method thereof.

2. Description of the Related Art

Hybrid vehicles incorporating an electric power generator driven by an engine, in addition to a vehicle-driving electric motor, have been known. Such a hybrid vehicle has a battery pack in which a plurality of battery cells are connected in series. Using electric power from the battery pack, the vehicle-driving electric motor is driven. Electric power from the generator is stored into the battery pack.

FIG. 3 illustrates the construction of a charge/discharge control apparatus for a battery pack as mentioned above. Referring to FIG. 3, a battery pack 12 is formed by a plurality of battery cells 10 connected in series. A voltage detector 14 for detecting the voltage of the individual cells 10 is connected to the battery pack 12. On the basis of an output of the voltage detector 14, a battery ECU 16 computes the state of charge SOC of the cells 10.

Normally, the battery pack 12 has an arrangement in which a plurality of battery blocks each formed by a plurality of battery cells 10 connected in series are connected in series. Therefore, the value of voltage detected by the voltage detector 14 may be the value of voltage of each cell 10 as mentioned above, or may be the value of voltage of each battery block. In the latter case, the battery ECU 16 computes the state of charge SOC of each battery block from the value of voltage of the battery block. On the basis of the thus-computed SOC value, an HVECU 18 controls loads 20 that include a vehicle-driving electric motor, a generator-driving engine, a generator, an inverter, etc., and performs control of adjusting the amount of charge of the battery pack 12 so that the SOC value of the battery pack 12 is within a predetermined range. A typically adopted control range of SOC is, for example, the range of 20% to 80%. An SOC control method for the battery pack 12 as described above is disclosed in Japanese Patent Application Laid-Open Publication No. 2000-14029.

The foregoing related-art control apparatus performs control such that the SOC of the battery pack 12 is within a predetermined range (e.g., of 20% to 80%). In this case, a battery block that exhibits the lower limit value (20%) of the control range is different from a battery block that exhibits the upper limit value (80%) of the control range. That is, if a control is performed such that the SOC of the battery pack 12 will not fall below the lower limit value of the control range, the control is performed as follows. That is, the remaining capacity of each battery block is determined from the voltage thereof. The SOC value of the battery block that exhibits the least value of the thus-determined remaining capacities is set as a least SOC value for use in the control of the SOC of the battery pack 12. The control is performed so as to prevent the least SOC value from falling below the lower limit value. If a control is performed such that the SOC of the battery pack 12 will not exceed the upper limit value of the control range, the control is performed as follows. That is, the SOC value of the battery block that exhibits the greatest value of the remaining capacities of the battery blocks is set as a greatest SOC value of the battery pack 12. The control is performed so as to prevent the greatest SOC value from increasing above the upper limit value.

The charge/discharge capabilities of the individual cells 10 vary with increasing time of use of the battery pack 12. That is, the variation in SOC among the cells 10 or the battery blocks is small as indicated in FIG. 4(2) during an initial period of use of the battery pack 12. However, as time elapses, the variation in SOC becomes greater as indicated in FIG. 4b.

SUMMARY OF THE INVENTION

In the case of the above-described related-art charge/discharge control apparatus, however, it is necessary to compute both the least value and the greatest value of SOC of the cells 10 or the battery blocks. Moreover, it is necessary to perform the control regarding the lower limit value of SOC through the use of the least value and the control regarding the upper limit value of SOC through the use of the greatest value separately from each other. Therefore, the related-art apparatus has a problem of complicated computation processes.

Furthermore, the variation in SOC among the cells 10 or among the battery blocks becomes great as indicated in FIG. 4b. Correspondingly, the SOC control precision decreases. Therefore, it becomes necessary to perform a uniformalization control of reducing the SOC variation among the battery cells by overcharging the cells 10 or the battery blocks. Due to the overcharging of the cells, the uniformalization control gives rise to a problem of reduced service life of the cells.

Accordingly, it is an object of the invention to provide a charge/discharge control apparatus for a battery pack which is capable of performing SOC control and reducing the SOC variation through simple processes, and a control method thereof In order to achieve the aforementioned object, a charge/discharge control apparatus for a battery pack having a plurality of cells according to one aspect of the invention includes a voltage detection portion that measures a voltage of each set of a predetermined number of cells provided in the battery pack, a computation portion that computes a state quantity of each set of the predetermined number of cells based on the voltage measured by the voltage detection portion, and a charge/discharge control portion that performs a charge/discharge control based on a least state quantity that is a least one of the state quantities of the sets of the predetermined number of cells.

According to the above-described construction, the charge/discharge control of the battery pack is performed using only the least one of the state quantities of the cells or the battery blocks of the battery pack. Therefore, the computation of SOC can be simplified. Furthermore, although execution of control of the upper limit value of SOC through the use of the least state quantity tends to further increase the amounts of charge of the cell with the greatest capacity value and cells having capacity values close to the greatest capacity value, actual SOC increases are curbed due to increases in self-discharge and decreases in charging efficiency. Therefore, the apparatus of the invention is able to curb the SOC variation without performing the uniformalization control by overcharging the cells.

In the above-described charge/discharge control apparatus for the battery pack, each set of the predetermined number of cells may be a single cell or a battery block in which a plurality of cells are connected in series.

Furthermore, in the charge/discharge control apparatus, the state quantity may be a remaining capacity value of each set of the predetermined number of cells based on the voltage, or may be a percentage of the remaining capacity value to a fully charged capacity value.

Further, the charge/discharge control apparatus may further include an overcharge determining portion that performs an overcharge determination as to whether an overcharged state exists based on a greatest state quantity that is a greatest one of the state quantities of the sets of the predetermined number of cells.

According to this construction, the overcharge determination is performed on the basis of the greatest one of the state quantities of the sets of the predetermined number of cells. Therefore, it becomes possible to prevent the service life reduction of the cells caused by the overcharging of the cells of the battery pack.

In accordance with another aspect of the invention, a charge/discharge control method for a battery pack having a plurality of cells includes measuring a voltage of each set of a predetermined number of cells provided in the battery pack, computing a state quantity of each set of the predetermined number of cells based on the voltage measured, and performing a charge/discharge control based on a least state quantity that is a least one of the state quantities of the sets of the predetermined number of cells.

In the above-described charge/discharge control method for the battery pack, each set of the predetermined number of cells may be a single cell or a battery block in which a plurality of cells are connected in series.

Furthermore, in the charge/discharge control method, the state quantity may be a remaining capacity value of each set of the predetermined number of cells based on the voltage, or may be a percentage of the remaining capacity value to a fully charged capacity value.

BRIEF DESCRIPTION OF THE DRAWINGS

The foregoing and further objects, features and advantages of the invention will become apparent from the following description of preferred embodiments with reference to the accompanying drawings, wherein like numerals are used to represent like elements and wherein.

DETAILED DESCRIPTION OF THE PREFERRED EMBODIMENTS

Figure 1A:
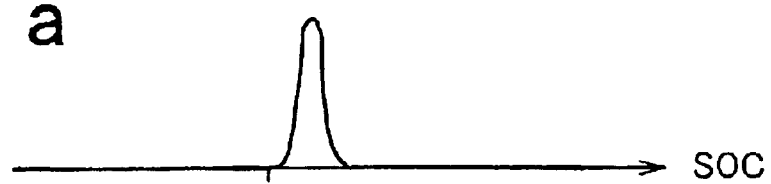
FIGS. 1a and 1b are diagrams illustrating SOC variations in a battery pack in accordance with the invention.
Figure 1B:
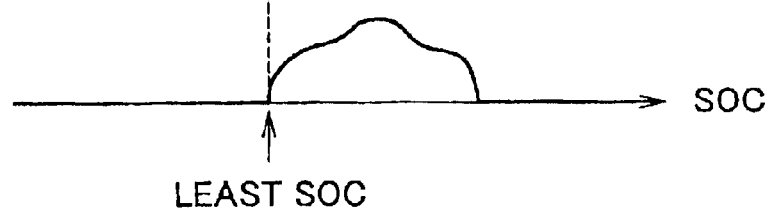
Figure 3:
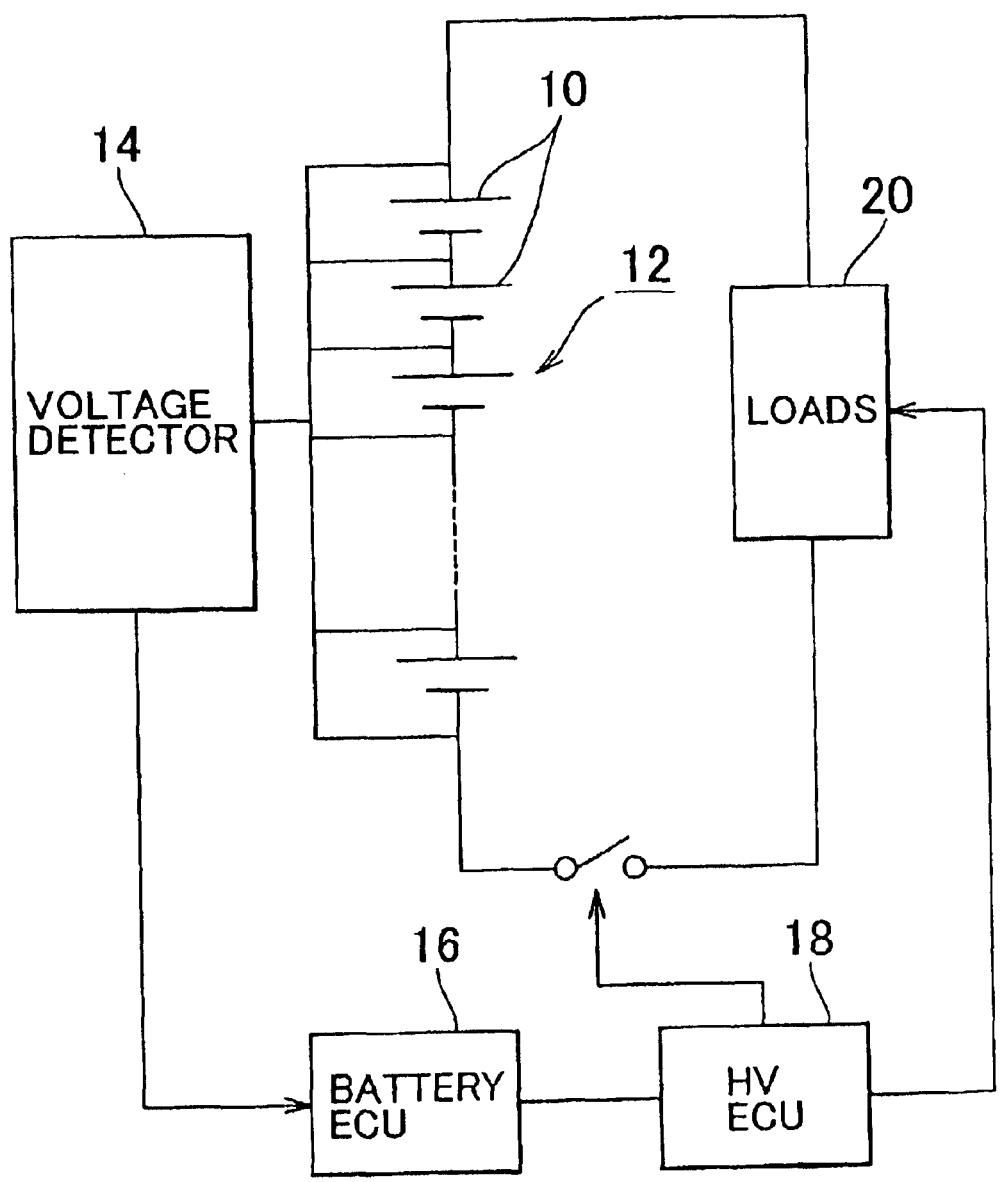
FIG. 3 is a diagram illustrating the construction of a charge/discharge control apparatus for the battery pack.
Figure 4A:
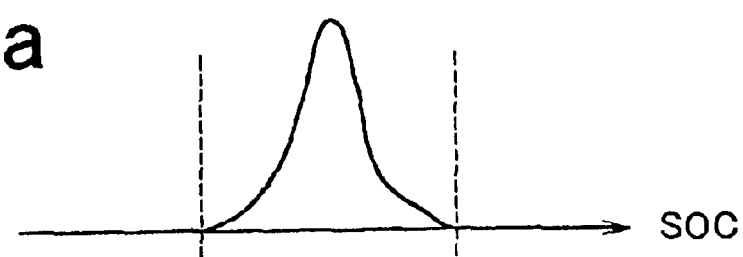
FIG. 4 is a diagram illustrating SOC variations in a related-art battery pack.
Figure 4B:

Preferred embodiments of the invention will be described hereinafter with reference to the accompanying drawings. FIGS. 1a and 1b are diagrams illustrating the variation in the control-purpose SOC used by the HVECU 18 shown in FIG. 3. In both cases of FIGS. 1a and 1b, the voltage of each cell 10 in the battery pack 12 is detected by the voltage detector 14. From the detected values, the battery ECU 16 computes the remaining capacities of the individual cells 10. The battery ECU 16 then determines a control-purpose SOC value, that is, a least SOC value of the battery pack 12, from the least capacity value of the computed remaining capacities. The control-purpose SOC value is the least one of the SOC values of the cells 10, and is expressed as a percentage of the least capacity value to the fully charged capacity. Instead of the least SOC value, the least one of the capacity values of the cells 10 determined by the battery ECU 16 may be used for the control.

On the basis of the control-purpose SOC value determined as described above, the HVECU 18 performs the charge/discharge control of the battery pack 12 so that the aforementioned SOC value is within a predetermined range, for example, of 20% to 80%, by a method as described above.

According to this control method, only the least SOC value, among the SOC values of the cells 10 of the battery pack 12, is used to perform the charge/discharge control. Therefore, the process of computing the control-purpose SOC value can be simplified.

As the time of use of the battery pack 12 increases, the SOC values of the cells 10 vary to greater extents as indicated in FIG. 1b, and the greatest value of the varying SOC values becomes larger than the greatest one of the SOC values exhibited immediately after the initiation of use of the battery pack 12, that is, the greatest one of the SOC values indicated in FIG. 1a. If in this case, the charge/discharge control is performed using only the aforementioned least SOC value, it is conceivable that the amount of charge of the cell 10 with the greatest SOC value and/or a cell 10 having an SOC value close to the greatest SOC value may increase beyond the control range. However, as the SOC value of a cell 10 increases, the charging efficiency of the cell 10 decreases and the self-discharge thereof increases. Therefore, the increases in the SOC values of the cells 10 at a greater SOC side in the range of variation are curbed even though the charge/discharge control is performed based on the least SOC value of the varying SOC values of the cells 10. Hence, expansion of the variation in SOC beyond a certain value will be avoided, without performing SOC uniformalization by bringing each cell 10 to an overcharged state. Thus, the need to perform the uniformalizing control is eliminated, so that the service life reduction of the battery caused by overcharge will be prevented.

Furthermore, the execution of the control using the least SOC value, that is, the least one of the varying SOC values, will prevent over-discharge of the cells 10 of the battery pack 12.

It should be noted herein that since the charge/discharge control of the battery pack 12 is performed on the basis of the least value of the varying SOC values, there is a possibility that a cell 10 will be overcharged. Therefore, it is preferable that, from the remaining capacities of the cells 10 of the battery pack 12, the greatest capacity value or the greatest SOC value be computed, and that guard determination be made, that is, determination be made as to whether a cell 10 is overcharged, on the basis of the greatest capacity value or the greatest SOC value. If any one of the cells 10 is overcharged, the upper limit value of the control range of SOC of the battery pack 12 may be reduced by a predetermined amount (e.g., about 10%) In this manner, overcharge of the cells 10 can be substantially prevented.

Figure 2A:
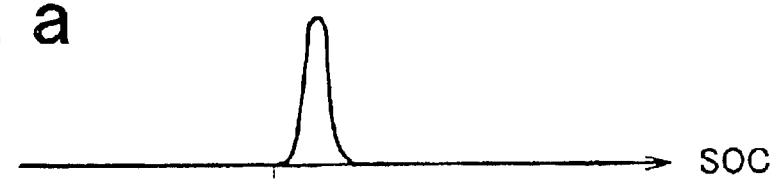
FIGS. 2a and 2b are diagrams illustrating SOC variations in a battery pack in accordance with the invention.
Figure 2B:
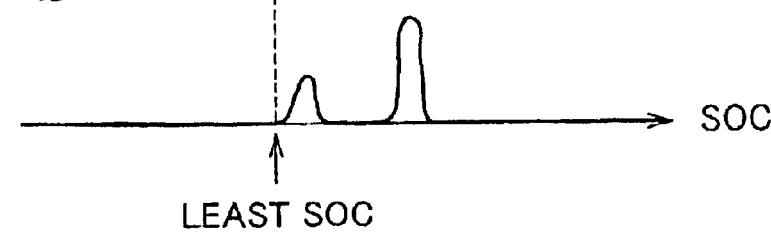

The HVECU 18 also performs the charge/discharge control through the use of the least one of the SOC values of all the cells 10 of the battery pack 12 if, from an initial state where all the cells 10 are normal and merely exhibit a narrow range of SOC variation as indicated in FIG. 2*a*, the SOC value of a cell 10 has considerably dropped as indicated in FIG. 2*b*. As a result of this manner of control, the state as indicated in FIG. 2*b* gradually disappears, and recovery to a state close to the state indicated in FIG. 1*a* can be achieved, due to the charging efficiency reduction and the self-discharge increase of high-SOC cells 10 as mentioned above.

As is apparent from the foregoing description, the invention allows easy computation of a control-purpose SOC value since the charge/discharge control of the battery pack 12 is performed on the basis of the least value of the SOC values of the cells 10 of the battery pack 12. Furthermore, since increase of the SOC values of high-SOC cells 10 can be curbed, variations in SOC can also be curbed.

Still further, if overcharge determination based on the greatest SOC value of the varying SOC values finds that an overcharged cell 10 exists, the upper limit value of the control range of SOC of the battery pack 12 is changed to a reduced value. Therefore, overcharge of the cells 10 can be substantially prevented.

Although in the foregoing embodiment, the battery pack 12 is controlled on the basis of the SOC or capacity value of the cells 10, it is also possible to control the battery pack on the basis of the SOC or capacity value of each battery block since the battery pack 12 has an arrangement in which a plurality of battery blocks each having a plurality of serially connected cells 10 are serially connected.

While the invention has been described with reference to what are presently considered to be preferred embodiments thereof, it is to be understood that the invention is not limited to the disclosed embodiments or constructions. On the contrary, the invention is intended to cover various modifications and equivalent arrangements. In addition, while the various elements of the disclosed invention are shown in various combinations and configurations, which are exemplary, other combinations and configurations, including more, less or only a single embodiment, are also within the spirit and scope of the invention.

What is claimed is:

1. A charge/discharge control apparatus for a battery pack having a plurality of cells, comprising:
    a voltage detection portion that measures a voltage of each set of a predetermined number of cells provided in the battery pack;
    a computation portion that computes a state quantity of each set of the predetermined number of cells based on the voltage measured by the voltage detection portion; and
    a charge/discharge control portion that performs a charge/discharge control based on only a least state quantity that is a least one of the state quantities of the sets of the predetermined number of cells, the charge/discharge control being performed so that only the least one of the state quantities is within a predetermined range.

2. The charge/discharge control apparatus according to claim 1,
    wherein each set of the predetermined number of cells is a single cell, and
    wherein the voltage detection portion measures a voltage of each single cell of the battery pack, and the computation portion computes a state quantity of each single cell.

3. The charge/discharge control apparatus according to claim 1,
    wherein each set of the predetermined number of cells has an arrangement of a battery block in which a plurality of cells are connected in series, and
    wherein the voltage detection portion measures a voltage of each battery block, and the computation portion computes a state quantity of each battery block.

4. The charge/discharge control apparatus according to claim 1, wherein the state quantity is a remaining capacity value of each set of the predetermined number of cells based on the voltage measured.

5. The charge/discharge control apparatus according to claim 1, wherein the state quantity is a percentage of a remaining capacity value of each set of the predetermined number of cells based on the voltage measured, with respect to a fully charged capacity value.

6. The charge/discharge control apparatus according to claim 1, further comprising an overcharge determining portion that performs an overcharge determination as to whether an overcharged state exists based on a greatest state quantity that is a greatest one of the state quantities of the sets of the predetermined number of cells.

7. The charge/discharge apparatus according to claim 6,
    wherein each set of the predetermined number of cells is a single cell, and
    wherein the greatest state quantity is a greatest one of the state quantities of the single cells.

8. The charge/discharge control apparatus according to claim 6,
    wherein each set of the predetermined number of cells has an arrangement of a battery block in which a plurality of cells are connected in series, and
    wherein the greatest state quantity is a greatest one of the state quantities of the battery blocks.

9. The charge/discharge control apparatus according to claim 6, wherein the state quantity is a remaining capacity value of each set of the predetermined number of cells based on the voltage measured.

10. The charge/discharge control apparatus according to claim 6, wherein the state quantity is a percentage of a remaining capacity value of each set of the predetermined number of cells based on the voltage measured, with respect to a fully charged capacity value.

11. A charge/discharge control method for a battery pack having a plurality of cells, comprising:
    measuring a voltage of each set of a predetermined number of cells provided in the battery pack;
    computing a state quantity of each set of the predetermined number of cells based on the voltage measured; and
    performing a charge/discharge control based on only a least state quantity that is a least one of the state quantities of the sets of the predetermined number of cells, so that only the least state quantity is within a predetermined range.

12. The charge/discharge control method according to claim 11, wherein each set of the predetermined number of cells is a single cell, and a voltage of each single cell of the battery pack is measured, and a state quantity of each single cell is computed.

13. The charge/discharge control method according to claim 11, wherein each set of the predetermined number of cells has an arrangement of a battery block in which a plurality of cells are connected in series, and a voltage of each battery block is measured, and a state quantity of each battery block is computed.

14. The charge/discharge control method according to claim 11, wherein the state quantity is a remaining capacity value of each set of the predetermined number of cells based on the voltage measured.

15. The charge/discharge control method according to claim 11, wherein the state quantity is a percentage of a remaining capacity value of each set of the predetermined number of cells based on the voltage measured, with respect to a fully charged capacity value.

16. The charge/discharge control method according to claim 11, further comprising performing an overcharge determination as to whether an overcharged state exists based on a greatest state quantity that is a greatest one of the state quantities of the sets of the predetermined number of cells.

17. The charge/discharge control method according to claim 16,
wherein each set of the predetermined number of cells is a single cell, and
wherein the greatest state quantity is a greatest one of the state quantities of the single cells.

18. The charge/discharge control method according to claim 16,
wherein each set of the predetermined number of cells has an arrangement of a battery block in which a plurality of cells are connected in series, and
wherein the greatest state quantity is a greatest one of the state quantities of the battery blocks.

19. The charge/discharge control method according to claim 16, wherein the state quantity is a remaining capacity value of each set of the predetermined number of cells based on the voltage measured.

20. The charge/discharge control method according to claim 16, wherein the state quantity is a percentage of a remaining capacity value of each set of the predetermined number of cells based on the voltage measured, with respect to a fully charged capacity value.

21. A charge/discharge control apparatus for a battery pack having a plurality of cells, comprising:
a voltage detection portion that measures a voltage of each set of a predetermined number of cells provided in the battery pack;
a computation portion that computes a state quantity of each set of the predetermined number of cells based on the voltage measured by the voltage detection portion;
a charge/discharge control portion that performs a charge/discharge control based on a least state quantity that is a least one of the state quantities of the sets of the predetermined number of cells; and
an overcharge determining portion that performs an overcharge determination as to whether an overcharged state exists based on a greatest state quantity that is a greatest one of the state quantities of the sets of the predetermined number of cells.

22. The charge/discharge control apparatus according to claim 21,
wherein each set of the predetermined number of cells is a single cell, and
wherein the greatest state quantity is a greatest one of the state quantities of the single cells.

23. The charge/discharge control apparatus according to claim 21,
wherein each set of the predetermined number of cells has an arrangement of a battery block in which a plurality of cells are connected in series, and
wherein the greatest state quantity is a greatest one of the state quantities of the battery blocks.

24. The charge/discharge control apparatus according to claim 21, wherein the state quantity is a remaining capacity value of each set of the predetermined number of cells based on the voltage measured.

25. The charge/discharge control apparatus according to claim 21, wherein the state quantity is a percentage of a remaining capacity value of each set of the predetermined number of cells based on the voltage measured, with respect to a fully charged capacity value.

26. A charge/discharge control method for a battery pack having a plurality of cells, comprising:
measuring a voltage of each set of a predetermined number of cells provided in the battery pack;
computing a state quantity of each set of the predetermined number of cells based on the voltage measured;
performing a charge/discharge control based on a least state quantity that is a least one of the state quantities of the sets of the predetermined number of cells; and
performing an overcharge determination as to whether an overcharged state exists based on a greatest state quantity that is a greatest one of the state quantities of the sets of the predetermined number of cells.

27. The charge/discharge control method according to claim 26,
wherein each set of the predetermined number of cells is a single cell, and
wherein the greatest state quantity is a greatest one of the state quantities of the single cells.

28. The charge/discharge control method according to claim 26,
wherein each set of the predetermined number of cells has an arrangement of a battery block in which a plurality of cells are connected in series, and
wherein the greatest state quantity is a greatest one of the state quantities of the battery blocks.

29. The charge/discharge control method according to claim 26, wherein the state quantity is a remaining capacity value of each set of the predetermined number of cells based on the voltage measured.

30. The charge/discharge control method according to claim 26, wherein the state quantity is a percentage of a remaining capacity value of each set of the predetermined number of cells based on the voltage measured, with respect to a fully charged capacity value.

* * * * *